US012224159B1

(12) United States Patent
Kuo et al.

(10) Patent No.: US 12,224,159 B1
(45) Date of Patent: Feb. 11, 2025

(54) GAS MIXING METHOD TO ENHANCE PLASMA

(71) Applicant: SKY TECH INC., Hsinchu County (TW)

(72) Inventors: Ta-Hao Kuo, Hsinchu County (TW); Chi-Hung Cheng, Hsinchu County (TW); Yao-Syuan Cheng, Hsinchu County (TW); Kuo-Ju Liu, Hsinchu County (TW); Ching-Liang Yi, Hsinchu County (TW)

(73) Assignee: SKY TECH INC., Zhubei (TW)

( * ) Notice: Subject to any disclaimer, the term of this patent is extended or adjusted under 35 U.S.C. 154(b) by 0 days.

(21) Appl. No.: 18/231,907

(22) Filed: Aug. 9, 2023

(51) Int. Cl.
*H01J 37/34* (2006.01)
*C23C 14/34* (2006.01)
*C23C 14/50* (2006.01)
*H01J 37/32* (2006.01)

(52) U.S. Cl.
CPC ........ *H01J 37/32449* (2013.01); *C23C 14/34* (2013.01); *C23C 14/345* (2013.01); *C23C 14/50* (2013.01); *H01J 37/32715* (2013.01); *H01J 37/3441* (2013.01); *H01J 2237/2007* (2013.01); *H01J 2237/20235* (2013.01); *H01J 2237/332* (2013.01)

(58) Field of Classification Search
CPC ..... H01J 2237/2007; H01J 2237/20235; H01J 2237/332; H01J 37/32449; H01J 37/32715; H01J 37/3441; C23C 14/34; C23C 14/345; C23C 14/50
USPC ........................... 204/298.07, 298.11, 298.03
See application file for complete search history.

(56) References Cited

U.S. PATENT DOCUMENTS

| 4,407,709 A | * | 10/1983 | Enjouji ............... C23C 14/0042 204/192.15 |
| 2002/0043466 A1 | * | 4/2002 | Dordi ...................... C23C 18/31 205/186 |

FOREIGN PATENT DOCUMENTS

| CN | 112760602 A | * | 5/2021 |
| JP | 09-111446 | * | 4/1997 |

OTHER PUBLICATIONS

Machine Translation CN112760602 (Year: 2021).*
Machine Translation JP 09-111446 (Year: 1997).*

* cited by examiner

*Primary Examiner* — Rodney G McDonald
(74) *Attorney, Agent, or Firm* — Chun-Ming Shih; HDLS IPR SERVICES

(57) ABSTRACT

A gas mixing method to enhance plasma includes: providing a reaction chamber; wherein the reaction chamber includes an accommodating space and the reaction chamber includes a top opening connected to the accommodating space; providing an adapter plate, and fixing the adapter plate to the reaction chamber to be arranged corresponding to the top opening; wherein the adapter plate further includes a window area communicating both sides of the adapter plate; providing a target disposed on top of the adapter plate to seal the top opening; premixing a plasma gas and an auxiliary gas into a gas mixture, and introducing the gas mixture into the accommodating space; and providing a biasing field to the accommodating space.

16 Claims, 6 Drawing Sheets

GAS MIXING METHOD TO ENHANCE PLASMA

BACKGROUND

Technical Field

This disclosure relates to coating equipment and coating methods, in particular to a gas mixing method to enhance plasma and an integrated airflow merging and diverting device.

Related Art

As shown in FIG. 1, In the coating equipment 1 for sputtering TiN, TaN, AlN, etc., the plasma gas and the reactive gas are introduced into the reaction zone 2a of the reaction chamber 2 through different pipelines. By applying a biasing signal to the holder plate 3, a biasing field is generated, which causes the plasma gas to undergo plasma ignition and applied on the target 4 to generate an atomic beam to sputter a wafer located on the holder plate 3, and the target particles sputtered on the wafer then react with the reactive gas to change the properties by chemical reactions.

Since the plasma gas and the reactive gas are introduced into the reaction chamber 2 separately, and the phenomenon of uneven distribution of the plasma gas, resulting in the plasma ignition process is difficult, or fails to achieve plasma ignition, and it is necessary to increase the voltage value of the biasing signal. In the case of TiN coatings, for example, it is often necessary to raise the voltage of the biasing signal above 800 volts and it must continue to act for more than three seconds before plasma ignition occurs.

In the art, solution to poor ignition is to increase the flow rate of the plasma gas so that it can be more fully distributed in the reaction zone. However, increasing the flow rate of the plasma gas will change the characteristics of sputtering, and the flow rate of the reactive gas has to be increased at the same time. Furthermore, an increase in gas flow causes the higher pressure in the reaction chamber and the overall process becomes unstable.

SUMMARY

In view of the above problem, this disclosure provides a gas mixing method to enhance plasma and an integrated airflow merging and diverting device, which is able to obtain well plasma ignition without changing the pressure and bias size.

This disclosure provides a gas mixing method to enhance plasma comprises the following steps: providing a reaction chamber; wherein the reaction chamber includes an accommodating space and the reaction chamber includes a top opening connected to the accommodating space; providing an adapter plate, and fixing the adapter plate to the reaction chamber to be arranged corresponding to the top opening; wherein the adapter plate further is provided with a window area communicating both sides of the adapter plate; providing a target disposed on top of the adapter plate to seal the top opening; premixing a plasma gas and an auxiliary gas into a gas mixture, and introducing the gas mixture into the accommodating space; and providing a biasing field to the accommodating space.

In one or more embodiments, the step of mixing the plasma gas and the auxiliary gas into the gas mixture comprises providing a mixing element for receiving the plasma gas and the auxiliary gas, and connecting the mixing element to the accommodating space.

In one or more embodiments, the mixing element is connected to an air intake channel of the adapter plate for communicating the window area and the accommodating space.

In one or more embodiments, the mixing element is connected to an air intake channel of the reaction chamber for communicating the accommodating space.

In one or more embodiments, the mixing element is connected to an air intake channel of the adapter plate and an air intake channel of the reaction chamber for communicating the window area and the accommodating space.

In one or more embodiments, the gas mixing method to enhance plasma further comprises disposing a wafer in the accommodating space with the wafer facing the target.

In one or more embodiments, the gas mixing method to enhance plasma further comprises disposing a holder plate in the accommodating space with a holding surface of the holder plate facing the target, and disposing the wafer on the holding surface.

In one or more embodiments, the gas mixing method to enhance plasma further comprises providing a linear actuator coupled to the holder plate to drive the holder plate to move relative to the target, so as to change the distance between the holder plate and the target.

In one or more embodiments, the step of providing the biasing field to the accommodating space comprises providing a biasing power source electrically connected to the holder plate and providing a biasing signal to the holder plate with the biasing power source, so as to generate the biasing field.

In one or more embodiments, the gas mixing method to enhance plasma further comprises continuously evacuating air form the accommodating space.

This disclosure also provides an integrated airflow merging and diverting device comprising: a reaction chamber, an adapter plate, a mixing element, a target and a biasing power source. The reaction chamber includes an accommodating space and a top opening connected to the accommodating space. The adapter plate is fixed to a top of the reaction chamber and disposed corresponding to the top opening; wherein the adapter plate further includes a window area communicating both sides of the adapter plate. The mixing element is configured to receive a plasma gas and an auxiliary gas, to mix the plasma gas and the auxiliary gas into a gas mixture, and to introduce the gas mixture into the accommodating space. The target is disposed on the adapter plate to seal the top opening. The biasing power source is configured to provide a biasing signal to the accommodating space, so as to ionize the plasma gas to achieve plasma ignition.

In one or more embodiments, the adapter plate is provided with an air intake channel, and the air intake channel connects an outer side surface of the adapter plate and the window area, and the mixing element is connected to the air intake channel.

In one or more embodiments, the mixing element is a manifold.

In one or more embodiments, the integrated airflow merging and diverting device further comprises a holder plate, disposed within the accommodating space; wherein a holding surface of the holder plate faces the target.

In one or more embodiments, the integrated airflow merging and diverting device further comprises a linear actuator, coupled to the holder plate; wherein the linear actuator is configured to drive the holder plate to move relative to the target.

In one or more embodiments, the biasing power source is electrically connected to the holder plate to provide the biasing signal to the holder plate.

In one or more embodiments, the integrated airflow merging and diverting device further comprises a clamping ring, disposed on an edge of the holding surface.

In one or more embodiments, the integrated airflow merging and diverting device further comprises a vacuum pump, connected to the reaction chamber and configured to the accommodating space to evacuate gas from the accommodating space.

In one or more embodiments, the integrated airflow merging and diverting device further comprises a shielding ring, being a circular structure and disposed within the accommodating space; wherein the shielding ring comprises a first side wall, being a circular wall, facing the adapter plate, and connected to an inner side surface of the adapter plate; a second side wall, being a circular wall in parallel to the first side wall, extending toward the target; wherein an inner side of the second side wall defines a shielding ring opening; and a bottom, connecting the first side wall and the second side wall.

The integrated airflow merging and diverting device further comprises a cover ring, disposed above the shielding ring; wherein the cover ring includes: a horizontal extension portion, directly or indirectly connected to the adapter plate; a vertical extension portion, located within an inner side of the first side wall, extending toward the bottom without contacting the bottom.

In one or more embodiments, the inner side of the adapter plate, the shielding ring and the first side wall define an auxiliary intake channel connecting to the air intake channel.

In one or more embodiments, the reaction chamber includes an air intake channel connected to the accommodating space and the mixing element for introducing the mixed air into the accommodating space.

By the above approach, the plasma gas introduced into the reaction area is well distributed and well mixed with reactive gas, so that the plasma ignition can be easily achieved without having to raise the voltage of the biasing signal or to raise the gas pressure in the reaction chamber, and improve the ignition efficiency.

BRIEF DESCRIPTION OF THE DRAWINGS

This disclosure will become more fully understood from the detailed description given herein below for illustration only, and thus not limitative of this disclosure, wherein.

DETAILED DESCRIPTION

Figure 1:
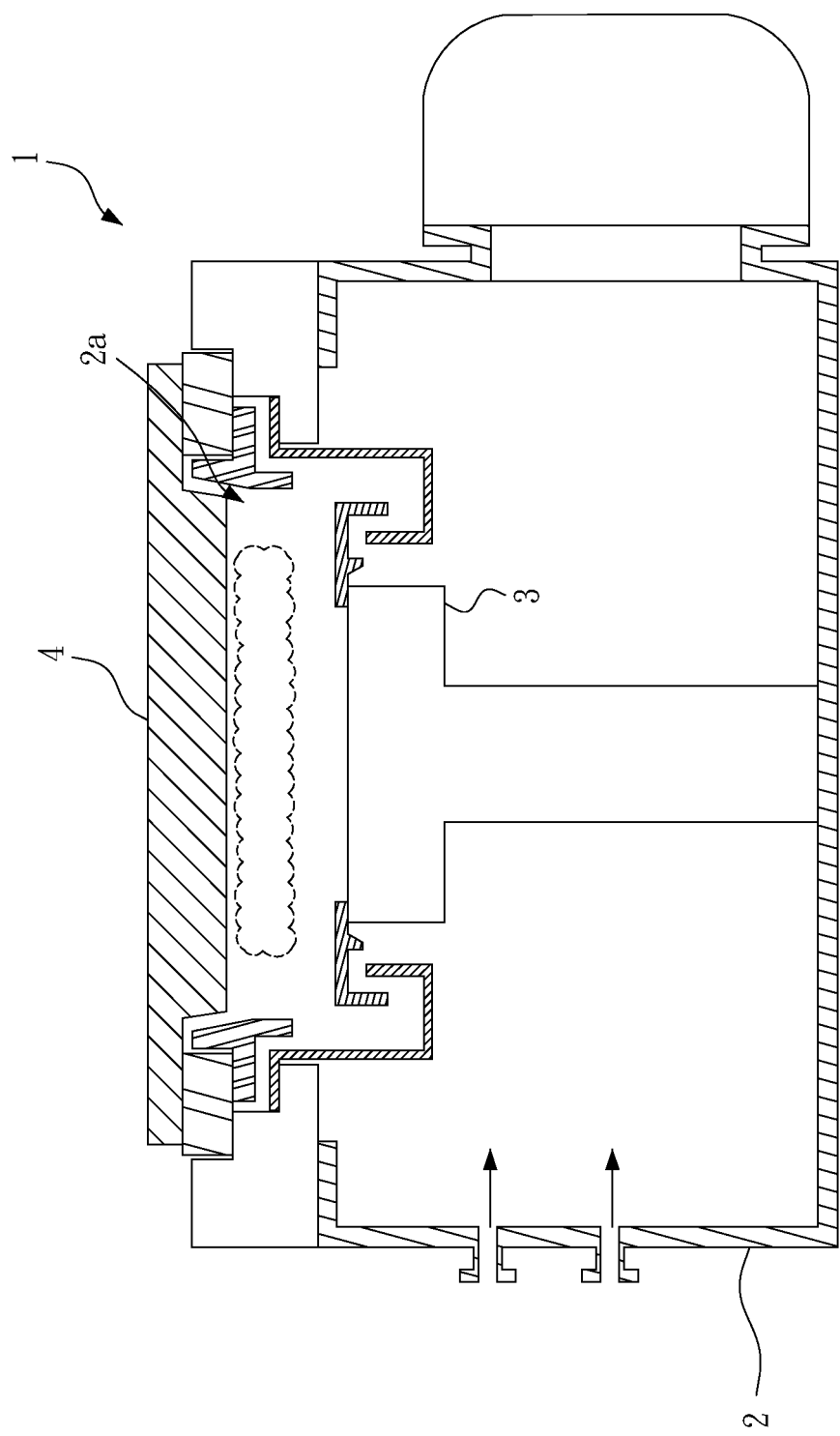
FIG. 1 is a cross-sectional view of a sputtering apparatus in the art.
Figure 2:
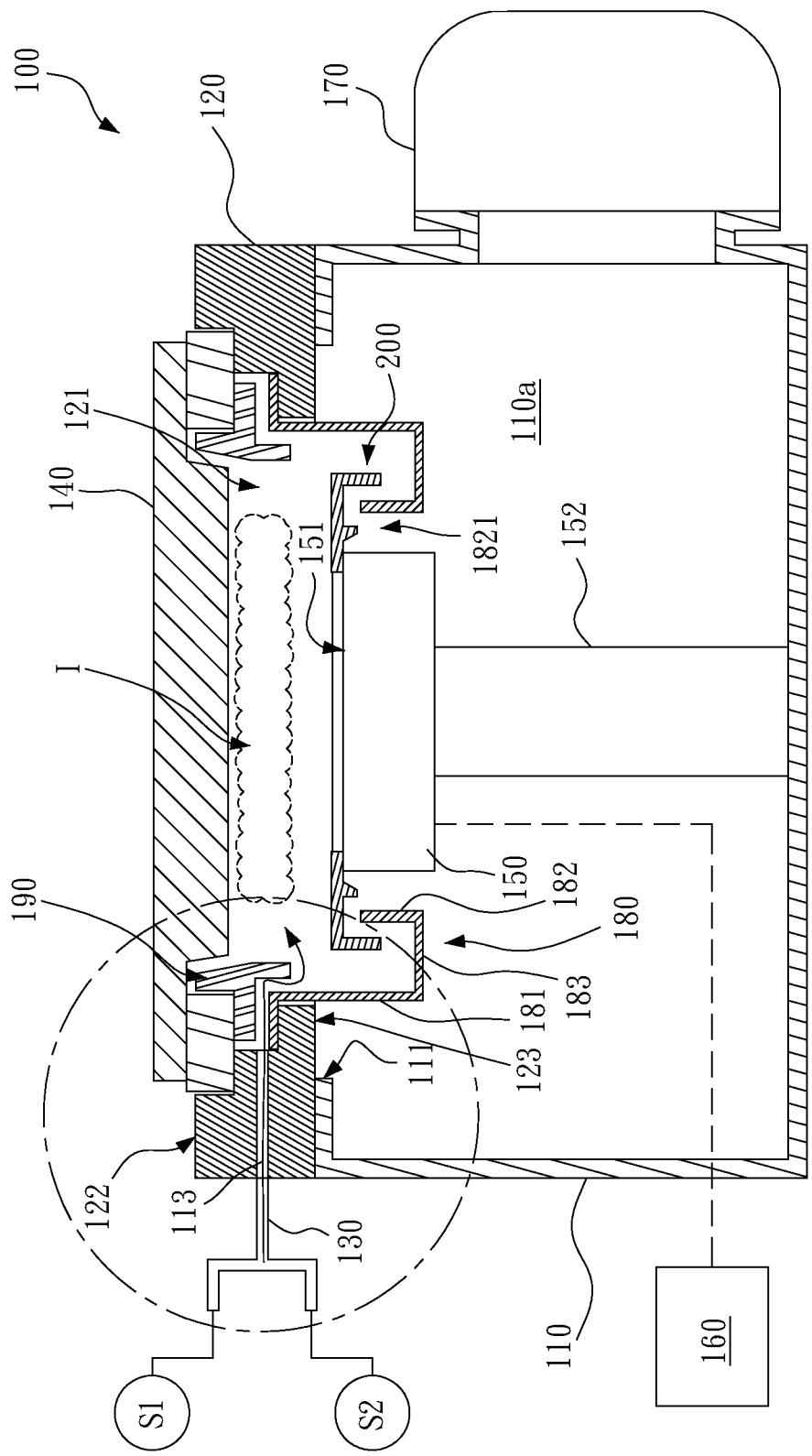
FIG. 2 is a cross-sectional view of an integrated airflow merging and diverting device according to an embodiment of this disclosure.

Please refer to FIG. 2, an integrated airflow merging and diverting device 100 according to an embodiment of this disclosure is shown, which is configured to perform a gas mixing method to enhance plasma.

Figure 3:
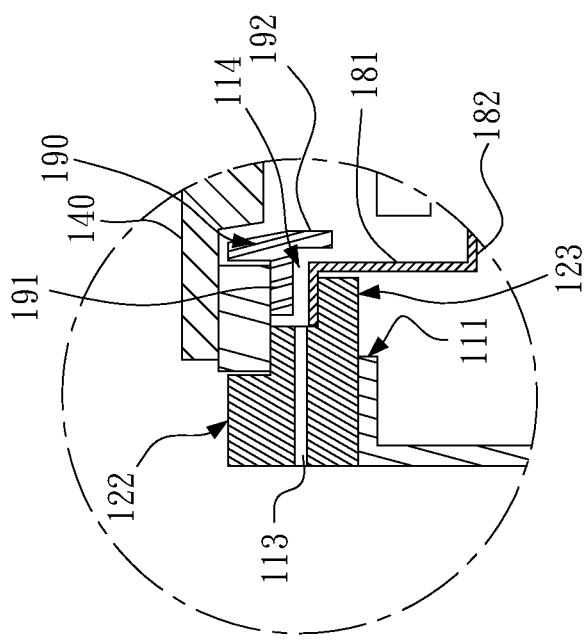
FIG. 3 illustrates an enlarged view of a portion in FIG. 2.

As shown in FIG. 2 and FIG. 3, The integrated airflow merging and diverting device 100 includes a reaction chamber 110, an adapter plate 120, a mixing element 130, a target 140, a holder plate 150, and a biasing power source 160.

As shown in FIG. 2, the reaction chamber 110 is provided with an accommodating space 110a for accommodating the holder plate 150. The reaction chamber 110 is further provided with a top opening 111 communicating with the accommodating space 110a.

As shown in FIG. 2 and FIG. 3, The adapter plate 120 is fixed to a top of the reaction chamber 110 and disposed corresponding to the top opening 111. The adapter plate 120 is further provided with a window area 121 communicating a top surface 122 and a bottom surface of the adapter plate 120. The adapter plate 120 is provided with an air intake channel 113, and the air intake channel 113 communicates an outer side surface of the adapter plate 120 and the window area 121.

As shown in FIG. 2 and FIG. 3, the mixing element 130 may be a manifold configured to connected to a plasma gas source S1 and an auxiliary gas source S2, and connected to the air intake channel 113. The mixing element 130 is configured to receive a plasma gas from the plasma gas source S1 and a auxiliary gas from the auxiliary gas source S2. The mixing element 130 is configured to mix the plasma gas and the auxiliary gas into a gas mixture, and introduce the gas mixture into the air intake channel 113, such that the gas mixture is introduced into the accommodating space 110a via the window area 121, the plasma gas is agitated to initial plasma ignition, and ionized gas molecules impact the target 140 to generate a target particle beam. The plasma gas may be Ar, and the auxiliary gas may be a reactive gas, which is selected according to the material of the target 140, such as N2, O2.

As shown in FIG. 2, the material of the target 140 may be Ti, Ta, Al. The target 140 is disposed on the adapter plate 120 to seal the top opening 111. The combination of the target 140 with the adapter plate 120 seals the top opening 111, such that the interior of the accommodation space 110a constitutes a closed space.

As shown in FIG. 2, the holder plate 150 is disposed within the accommodating space 110a, and a holding surface 151 of the holder plate 150 faces the target 140. the holder plate 151 is configured to hold a wafer. A reaction space I is defined between the holder plate 150 and the target 140, with a portion or all of the reaction space I located in the window area 121. The gas mixture of the plasma gas and auxiliary gas is introduced into the reaction space I for initializing plasma ignition of the plasma gas.

As shown in FIG. 2, The holder plate 150 is connected to a linear actuator 152. The linear actuator 152 is configured to drive the holder plate 150 to move relative to the target 140, so as to change the distance between the holder plate 150 and the target 140. The linear actuator 152 may be, but not limited to, a hydraulic actuator, a pneumatic actuator, a linear screw actuator, and the like. Driven by the linear actuator 152, the holder plate 150 moves the wafer toward the target 140 to reduce the distance between the wafer carried by the holder plate 150 and the target 140, so as to process the wafer by plasma.

As shown in FIG. 2, the biasing power source 160 is electrically connected to the holder plate 150 to provide a biasing signal to the holder plate 150, a biasing field is generated between the holder plate 150 and the target 140, so as to ionize the plasma gas to perform plasma ignition.

As shown in FIG. 2, The integrated airflow merging and diverting device 100 of this disclosure can be a sputter deposition equipment, by introducing the gas mixture of the plasma gas and the auxiliary gas, the plasma gas is ionized to initialize plasma ignition under the biasing field, and the target 140 is subjected to the plasma action to produce a molecular beam formed from the target 140. The molecular beam of the target 140 sputters on the wafer to form a thin film on the surface of the wafer, the thin film reacts with the auxiliary gas to change the properties of the thin film.

As shown in FIG. 2, The integrated airflow merging and diverting device 100 further includes a vacuum pump 170 connected to the reaction chamber 110. The vacuum pump 170 is configured to evacuates air from the accommodating space 110a, to keep the accommodating space 110a at a low pressure state and to induce a continuous flow of the gas mixture.

As shown in FIG. 2 and FIG. 3, the integrated airflow merging and diverting device 100 further includes a shielding ring 180, a cover ring 190 and a clamping ring 200.

As shown in FIG. 2 and FIG. 3, the shielding ring 180 is a circular structure and disposed within the accommodating space. The shielding ring 180 includes a first side wall 181, a second side wall 182, and a bottom 183. The material of the shielding ring 180 may be a metal or ceramic material, but the use of other materials is not excluded. The first side wall 181 is a circular wall, facing the adapter plate 120, and connected to an inner side surface of the adapter plate 120. The second side wall 182 is a circular wall in parallel to the first side wall 181, and extends toward the target 140. The bottom 183 is connected to the first side wall 181, and the second side wall 182. An inner side of the second side wall 182 defines a shielding ring opening 1821. The holder plate 150 can move toward the target 140 to contact the shielding ring 180 or to enter the shielding ring opening 1821, so as to define the reaction space I among the holder plate 150, the target 140, the adapter plate 120 and the shielding ring 180.

As shown in FIG. 2 and FIG. 3, the cover ring 190 is disposed above the shielding ring 180, and the cover ring 190 includes a horizontal extension portion 191 and a vertical extension portion 192. The horizontal extension portion 191 is directly or indirectly connected to the adapter plate 120, and does not block the end of the air intake channel 113 communicating with the window area 121. The vertical extension portion 192 is located at the inner side of the first side wall 181 and extends toward the bottom 183 without contacting the bottom 183. The inner side surface of the adapter plate 120, the shielding ring 180 and the first side wall 181 define an inner side surface 114 connected to the air intake channel 113. The auxiliary air inlet 114 elongates the flow path of the gas mixture, allowing the plasma gas and the auxiliary gas to be mixed much better.

As shown in FIG. 2, the clamping ring 200 is disposed on an edge of the holding surface 151, and is configured to encircle the wafer to fix the wafer on the holding surface 151.

As shown in FIG. 2, the plasma gas source S1 and the auxiliary gas source S2 are respectively connected to the mixing element 130, so as to provide the plasma gas and the auxiliary gas to the mixing element 130. The plasma gas and the auxiliary gas are mixed in the mixing element 130 and then enter the air intake channel 113 and the auxiliary intake channel 114. And then the gas mixture of the plasma gas and the auxiliary gas which is helpful for plasma ignition enters the reaction space I.

Figure 4:
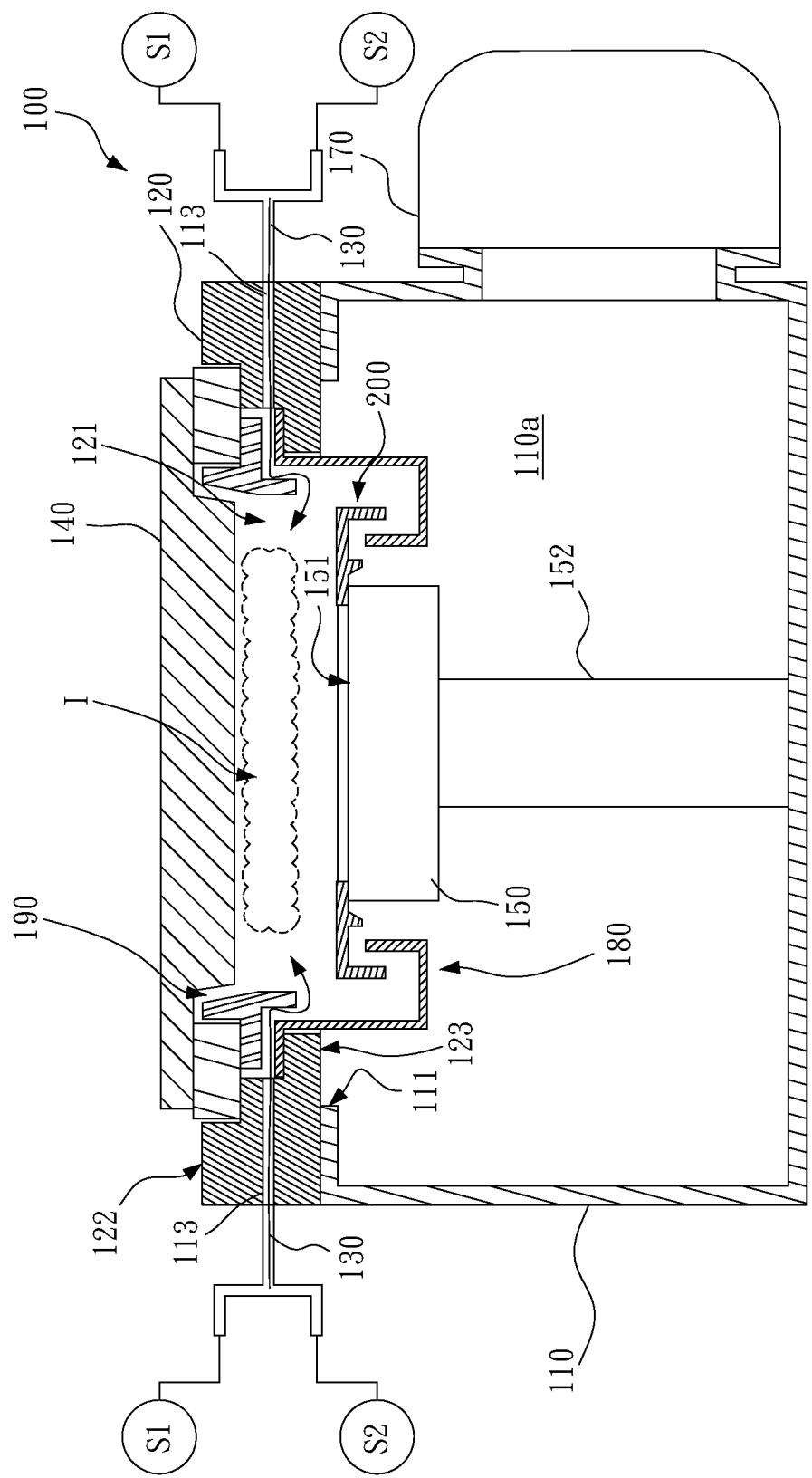
FIG. 4 and FIG. 5 are cross-sectional views of the integrated airflow merging and diverting device, showing different examples.

As shown in FIG. 4, In different embodiments, the number of air intake channels 113 may be more than one, such as two or even more as illustrated in the drawings, and each air intake channel 113 is connected to the same or a different mixing element 130 to receive the gas mixture respectively, so that the plasma gas may be distributed more uniformly in the reaction space I.

Figure 5:
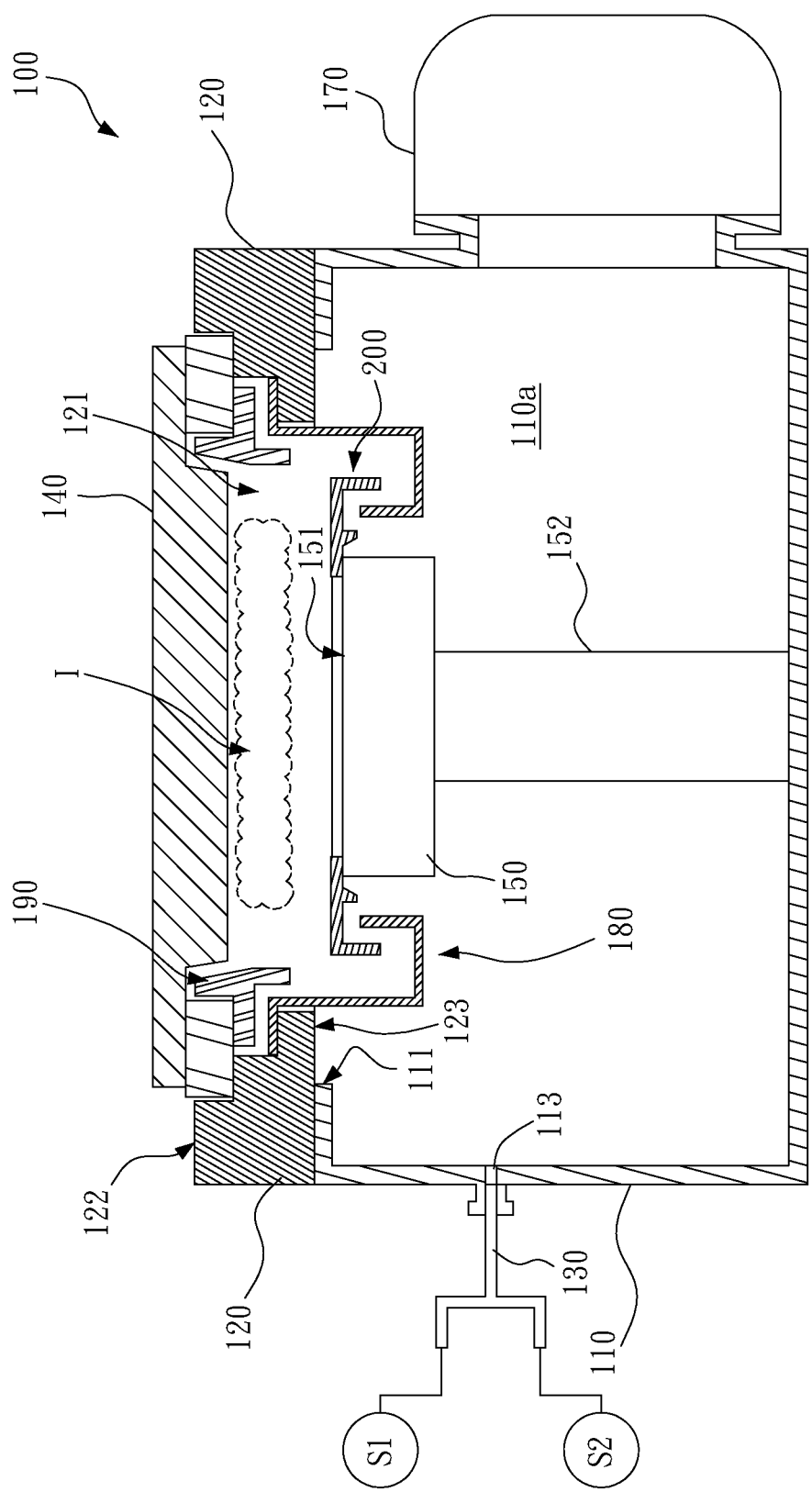

As shown in FIG. 5, The air intake channel 113 may also be disposed to the reaction chamber 110, connecting the holding space 110a with the premixing element 130, to introduce the gas mixture into the accommodating space 110a, and the gas mixture is then flowed to the reaction space I. In addition, in one embodiment, Plural air intake channels 113 can be respectively arranged to the adapter plate 120 and the reaction chamber 110.

Figure 6:
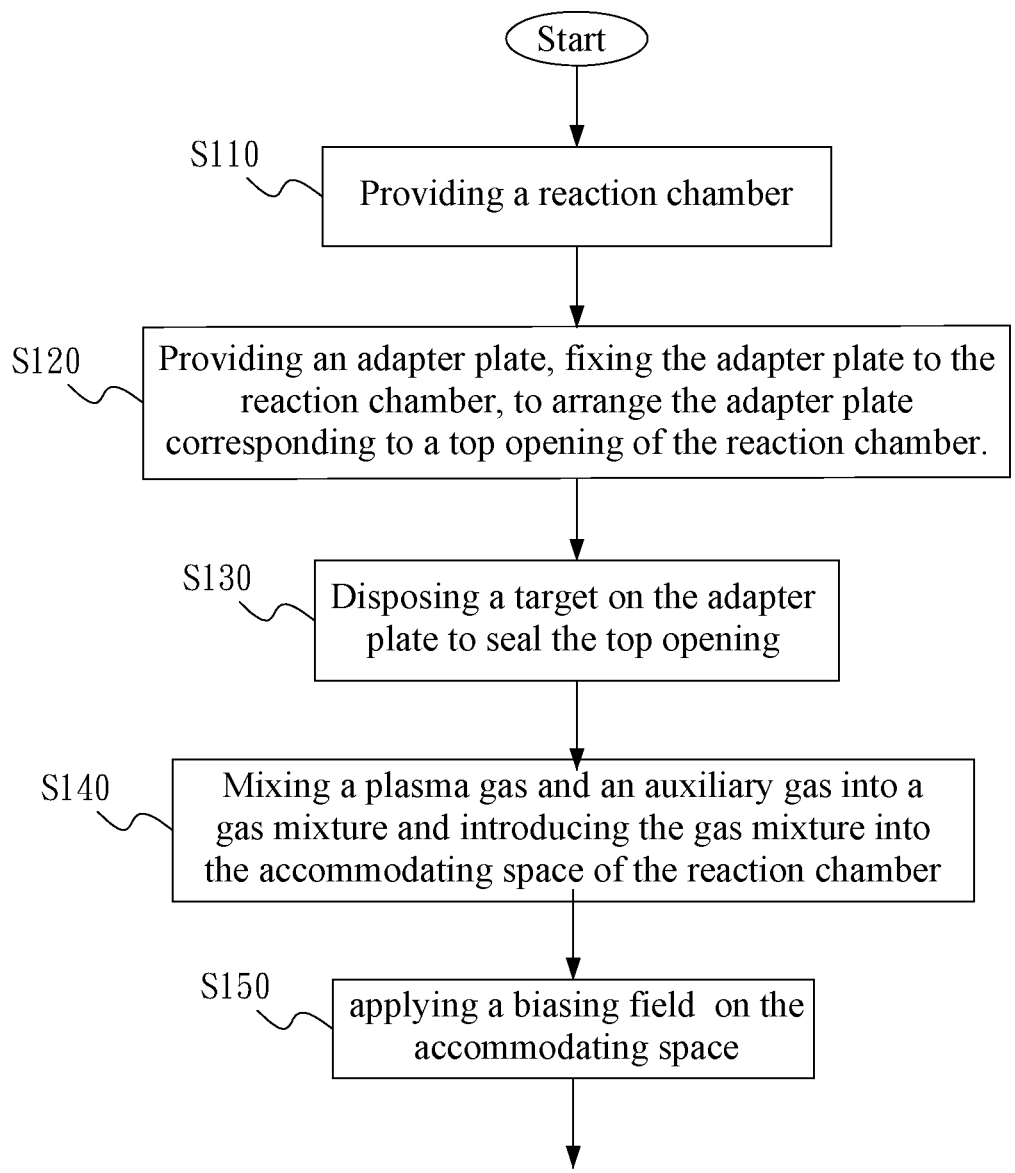
FIG. 6, shows a gas mixing method to enhance plasma according to this disclosure.

Referring to FIG. 6, a gas mixing method to enhance plasma according to this disclosure is shown.

As shown in FIG. 6, according to the method, a reaction chamber 110 is provided, as shown in step S110. the reaction chamber 110 is provided with an accommodating space 110a The reaction chamber 110 is further provided with an top opening 111 communicating with the accommodating space 110a.

As shown in FIG. 6, an adapter plate 120 is provided to be fixed to a top of the reaction chamber 110 and to be disposed corresponding to the top opening 111, as shown in step S120. The adapter plate 120 is further provided with a window area 121 communicating a top surface 122 and a bottom surface of the adapter plate 120.

As shown in FIG. 6, a target 140 is disposed on the adapter plate 129 to seal the top opening 111, as shown in step S130. The combination of the target 140 with the adapter plate 120 seals the top opening 111, such that the interior of the accommodation space 110a constitutes a closed space.

As shown in FIG. 6, a plasma gas and an auxiliary gas is pre-mixed into a gas mixture and introduced into the accommodating space 110a, as shown in step S140.

As shown in FIG. 6, a biasing field is applied on the accommodating space 110a, so as to ionize the plasma gas to achieve plasma ignition, as shown in step S150. An approach to provide the biasing field is to electrically connect a biasing power source 160 to the holder plate 150, so as to provide a biasing signal to the holder plate 150 by the biasing power source 160. The biasing field is generated between the holder plate 150 and target 140, so as to ionize the plasma gas to perform plasma ignition.

As shown in FIG. 2, FIG. 4 and FIG. 5, the step of mixing the plasma gas and the auxiliary gas includes providing a mixing element 130 to receiving the plasma gas and the auxiliary gas, and the mixing element 140 communicates with the accommodating space 110a. The mixing element 30 can be connected to an air intake channel 113 of the adapter plate 120 to communicate with the window area 121 and the accommodating space 110a, so as to introduce the gas mixture into the accommodating space via the window area 121. The mixing element 130 can be connected to an air intake channel 113 of the reaction chamber 113 to communicate with the accommodating space 110a, so as to introduce the gas mixture into the accommodating space 110a.

Before introducing the plasma gas and the auxiliary gas, the method includes a step of disposing a holder plate 150 within the accommodating space 110a with a holding surface 151 of the holder plate 150 facing the target 140 and placing a wafer on the holding surface 151, such that the wafer is located within the accommodating space 110a and faces the target 140.

As flowing in the mixing element 130 and the air intake channel 113 the plasma gas and the auxiliary gas are well mixed, and a gas mixture is introduced into the window area 121/reaction area I to initial plasma ignition, such that ionized gas of the plasma impacts the target 140 to generate particle beam projected to the wafer.

The step of disposing the holder plate 150 further includes providing a linear actuator 152 connected to the holder plate 150 to drive the holder plate 150 to move relative to the target 140, so as to change the distance between the holder plate 150 and the target 140.

Before or after introducing the plasma gas and the auxiliary gas, the method further includes a step of providing a vacuum pump 170 connected to the reaction pump 110 to continuously evacuate gas from the accommodating space 110a. Evacuating gas keeps the accommodating space 110a at a low pressure for plasma ignition and induces a continuous flow of the gas mixture.

The method further includes a step of providing a shielding ring 180 disposed within the accommodating space 110a. The shielding ring 180 includes a first side wall 181, a second side wall 182, and a bottom 183. The first side wall 181 is a circular wall, facing the adapter plate 120, and connected to an inner side surface of the adapter plate 120. The second side wall 182 is a circular wall in parallel to the first side wall 181, and extends toward the target 140. An inner side of the second side wall 182 defines a shielding ring opening 1821. The shielding ring opening 1821 is arranged corresponding to the holder plate 150.

The method further includes a step of providing a cover ring 190 disposed above the shielding ring 180. The cover ring 190 includes a horizontal extension portion 191 and a vertical extension portion 192. The horizontal extension portion 191 is directly or indirectly connected to the adapter plate 120, and does not block the end of the air intake channel 113 communicating the window area 121. The vertical extension portion 192 is located at the inner side of the first side wall 181 and extends toward the bottom 183 without contacting the bottom 183. The method further includes a step of providing a clamping ring 200 disposed on an edge of the holding surface 151, and is configured to encircle the wafer to fix the wafer on the holding surface 151.

As described above, The inner side surface of the adapter plate 120, the shielding ring 180 and the first side wall 181 define an inner side surface 114 connected to the air intake channel 113. The auxiliary air inlet 114 elongates the flow path of the gas mixture, allowing the plasma gas and the auxiliary gas to be mixed much better.

By the above approach, the plasma gas introduced into the reaction area is well distributed and well mixed with reactive gas, so that the plasma ignition can be easily achieved without having to raise the voltage of the biasing signal or to raise the gas pressure in the reaction chamber, and improve the ignition efficiency.

What is claimed is:

1. A gas mixing method to enhance plasma comprising:
providing a reaction chamber; wherein the reaction chamber includes an accommodating space and the reaction chamber includes a top opening connected to the accommodating space;
providing an adapter plate, and fixing the adapter plate to the reaction chamber to be arranged corresponding to the top opening; wherein the adapter plate further includes a window area communicating both sides of the adapter plate and an air intake channel connecting an outer side surface of the adapter plate and the window area;
providing a target disposed on top of the adapter plate to seal the top opening,
premixing a plasma gas and an auxiliary gas into a gas mixture, and introducing the gas mixture into the accommodating space;
providing a biasing field to the accommodating space wherein disposing a holder plate in the accommodating space, providing a biasing power source electrically connected to the holder plate, and providing a biasing signal to the holder plate with the biasing power source, so as to generate the biasing field;
providing a shielding ring disposed within the accommodating space; wherein the shielding ring is a circular structure and comprises a first side wall, a second side wall and a bottom; the first side wall is a circular wall, facing the adapter plate, and connected to an inner side surface of the adapter plate; the second side wall is the circular wall in parallel to the first side wall, and extends toward the target, and an inner side of the second side wall defines a shielding ring opening; the bottom connects the first side wall and the second side wall; and
providing a cover ring disposed above the shielding ring, wherein the cover ring comprises a horizontal extension portion and a vertical extension portion; the horizontal extension portion is directly or indirectly connected to the adapter plate and extends toward the bottom without contacting the bottom; the inner side of the adapter plate, the shielding ring and the first side wall define an auxiliary intake channel connecting to the air intake channel.

2. The gas mixing method to enhance plasma according to claim 1, wherein the step of mixing the plasma gas and the auxiliary gas into the gas mixture comprises providing a mixing element for receiving the plasma gas and the auxiliary gas, and connecting the mixing element to the accommodating space.

3. The gas mixing method to enhance plasma according to claim 2, wherein the mixing element is connected to the air intake channel of the adapter plate for communicating the window area and the accommodating space.

4. The gas mixing method to enhance plasma according to claim 2, wherein the mixing element is connected to an air intake channel of the reaction chamber for communicating the accommodating space.

5. The electrical connecting assembly according to claim 3, wherein one extending ends of the plurality of first contacting pieces comprises a bent contacting part; one extending ends of the plurality of second contacting pieces comprises a bent contacting part.

6. The gas mixing method to enhance plasma according to claim 1, further comprising disposing a wafer in the accommodating space with the wafer facing the target.

7. The gas mixing method to enhance plasma according to claim 6, further comprising a holding surface of the holder plate facing the target, and disposing the wafer on the holding surface.

8. The gas mixing method to enhance plasma according to claim 7, further comprising providing a linear actuator coupled to the holder plate to drive the holder plate to move relative to the target, so as to change the distance between the holder plate and the target.

9. The gas mixing method to enhance plasma according to claim 1, further comprising continuously evacuating air from the accommodating space.

10. An integrated airflow merging and diverting device comprising:

a reaction chamber, including an accommodating space and a top opening connected to the accommodating space;

an adapter plate, fixed to a top of the reaction chamber and disposed corresponding to the top opening; wherein the adapter plate further includes a window area communicating a top surface and a bottom surface of the adapter plate and an air intake channel connecting an outer side surface of the adapter plate and the window area;

a mixing element, configured to receive a plasma gas and a auxiliary gas, to mix the plasma gas and the auxiliary gas into a gas mixture, and to introduce the gas mixture into the accommodating space;

a target, disposed on the adapter plate to seal the top opening; and a biasing power source, configured to provide a biasing signal to the accommodating space, so as to ionize the plasma gas to achieve plasma ignition;

a holder plate, disposed within the accommodating space, and the biasing power source is electrically connected to the holder plate to provide the biasing signal to the holder plate;

a shielding ring being a circular structure, disposed within the accommodating space and comprising:

a first side wall, being a circular wall, facing the adapter plate, and connected to an inner side surface of the adapter plate;

a second side wall, being a circular wall in parallel to the first side wall, extending toward the target; wherein an inner side of the second side wall defines a shielding ring opening; and a bottom, connecting the first side wall and the second side wall; and a cover ring disposed above the shielding ring and comprising:

a horizontal extension portion, directly or indirectly connected to the adapter plate;

a vertical extension portion, located within an inner side of the first side wall, and extending toward the bottom without contacting the bottom; wherein the inner side of the adapter plate, the shielding ring and the first side wall define an auxiliary intake channel connecting to the air intake channel.

11. The integrated airflow merging and diverting device according to claim 10, wherein the mixing element is connected to the air intake channel.

12. The integrated airflow merging and diverting device according to claim 10, wherein a holding surface of the holder plate faces the target.

13. The integrated airflow merging and diverting device according to claim 12, further comprising a linear actuator, coupled to the holder plate; wherein the linear actuator is configured to drive the holder plate to move relative to the target.

14. The integrated airflow merging and diverting device according to claim 12, further comprising a clamping ring, disposed on an edge of the holding surface.

15. The integrated airflow merging and diverting device according to claim 10, wherein a vacuum pump, connected to the reaction chamber and configured to the accommodating space to evacuate gas from the accommodating space.

16. The integrated airflow merging and diverting device according to claim 10, wherein the reaction chamber includes an air intake channel connected to the accommodating space and the mixing element for introducing the mixed air into the accommodating space.

\* \* \* \* \*